United States Patent
Chiou et al.

(10) Patent No.: US 9,627,498 B2
(45) Date of Patent: Apr. 18, 2017

(54) CONTACT STRUCTURE FOR THIN FILM SEMICONDUCTOR

(71) Applicant: MACRONIX INTERNATIONAL CO., LTD., Hsinchu (TW)

(72) Inventors: Jia-Rong Chiou, Hsinchu (TW); Yu-Wei Jiang, Hsinchu (TW); Teng-Hao Yeh, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/717,177

(22) Filed: May 20, 2015

(65) Prior Publication Data

US 2016/0343821 A1    Nov. 24, 2016

(51) Int. Cl.
*H01L 21/768* (2006.01)
*H01L 21/70* (2006.01)
(Continued)

(52) U.S. Cl.
CPC ...... *H01L 29/458* (2013.01); *H01L 21/02532* (2013.01); *H01L 21/28518* (2013.01);
(Continued)

(58) Field of Classification Search
CPC ......... H01L 21/28518; H01L 21/32053; H01L 21/76855; H01L 21/76858; H01L 21/76864; H01L 21/76859; H01L 21/76843; H01L 21/76846; H01L 29/665; H01L 27/11578–27/11582; H01L 27/0688–27/0694;
(Continued)

(56) References Cited

U.S. PATENT DOCUMENTS 5,169,803 A * 12/1992 Miyakawa ........ H01L 21/28512
257/E21.585
6,046,478 A *  4/2000 Klein ..................... H01L 27/11
257/329
(Continued)

OTHER PUBLICATIONS

Goulding, "The Selective Epitaxial Growth of Silicon," Journal de Physique IV, 02 (C2), Jan. 1, 1991, 35 pages.
(Continued)

*Primary Examiner* — Marvin Payen
*Assistant Examiner* — Jeremy Joy
(74) *Attorney, Agent, or Firm* — Haynes Beffel & Wolfeld LLP

(57) ABSTRACT

A method is described for forming a circuit that comprises forming a layer of semiconductor material on the substrate and an interlayer conductor contacting the layer. The layer can be a thin film layer. An opening is etched in an interlayer insulator over a layer of semiconductor material, to expose a landing area on the layer of semiconductor material. The semiconductor material exposed by the opening is thickened by adding some of the semiconductor material within the opening. The process for adding the semiconductor material can include a blanket deposition, or a selective growth only within the landing area. A reaction precursor, such as a silicide precursor is deposited on the landing area in the opening. A reaction of the precursor with the semiconductor material in the opening is induced. An interlayer conductor is formed within the opening.

17 Claims, 11 Drawing Sheets

(51) Int. Cl.
*H01L 29/45* (2006.01)
*H01L 21/02* (2006.01)
*H01L 21/285* (2006.01)
*H01L 29/66* (2006.01)
*H01L 29/786* (2006.01)
*H01L 27/11556* (2017.01)
*H01L 27/11582* (2017.01)
*H01L 27/11548* (2017.01)
*H01L 27/11575* (2017.01)

(52) U.S. Cl.
CPC .. *H01L 21/76831* (2013.01); *H01L 21/76843* (2013.01); *H01L 21/76855* (2013.01); *H01L 21/76859* (2013.01); *H01L 27/11556* (2013.01); *H01L 27/11582* (2013.01); *H01L 29/6675* (2013.01); *H01L 29/78672* (2013.01); *H01L 27/11548* (2013.01); *H01L 27/11575* (2013.01)

(58) Field of Classification Search
CPC ..... H01L 27/1151–27/11556; H01L 27/11597; H01L 21/76816; H01L 21/76831
See application file for complete search history.

(56) References Cited

U.S. PATENT DOCUMENTS

| | | | | |
|---|---|---|---|---|
| 6,093,968 A * | 7/2000 | Honeycutt | ........ | H01L 21/76882 257/751 |
| 6,239,029 B1 * | 5/2001 | Honeycutt | ........ | H01L 21/28518 257/E21.165 |
| 6,376,368 B1 * | 4/2002 | Jung | ........ | H01L 21/28518 257/E21.165 |
| 8,633,099 B1 * | 1/2014 | Shih | ........ | H01L 21/76805 257/758 |
| 8,928,149 B2 | 1/2015 | Chen | | |
| 2010/0265773 A1 * | 10/2010 | Lung | ........ | G11C 16/0458 365/185.27 |
| 2011/0286283 A1 * | 11/2011 | Lung | ........ | G11C 16/0483 365/185.28 |
| 2013/0075912 A1 * | 3/2013 | Wakatsuki | ........ | H01L 21/28556 257/753 |
| 2013/0181264 A1 * | 7/2013 | Liao | ........ | H01L 29/785 257/288 |
| 2014/0264925 A1 * | 9/2014 | Chen | ........ | H01L 21/76816 257/774 |
| 2015/0206881 A1 * | 7/2015 | Tsai | ........ | H01L 27/0922 257/369 |
| 2015/0380304 A1 * | 12/2015 | Sung | ........ | H01L 21/76846 257/288 |
| 2016/0005824 A1 * | 1/2016 | Lin | ........ | H01L 29/41791 438/283 |
| 2016/0035569 A1 * | 2/2016 | Rumer | ........ | C23C 14/0036 438/584 |

OTHER PUBLICATIONS

Mann, et al., "Silicides and local interconnections for high-performance VLSI applications," IBM Journal of Research and Development, vol. 39, No. 4, Jul. 4, 1995, pp. 403-417.

U.S. Appl. No. 14/284,306 entitled "3D Independent Double Gate Flash Memory," filed May 21, 2014, 60 pages.

* cited by examiner

CONTACT STRUCTURE FOR THIN FILM SEMICONDUCTOR

BACKGROUND

Technological Field

The present technology relates to three-dimensional (3D) integrated circuits and, in particular, to providing interlayer conductors to multiple planes of circuits in the devices.

Description of Related Art

In the development of integrated circuits with high density, transistor structures are being created that have thin film channels and other structures with thicknesses on the nanometer scale. For example, 3D integrated circuits include multiple active layers in which thin film semiconductor layers are configured as active devices such as logic transistors, switching transistors and memory transistors. In some types of 3D memory integrated circuits the arrays comprise stacks of two-dimensional arrays of memory cells. Active layers in the stacks can include bit lines or word lines, for example, which must be connected to peripheral circuits like decoders, sense amplifiers and the like. In some arrangements, the connections are made using interlayer conductors that extend from each active layer to a routing layer, such as a patterned metal layer that overlies the stacks of two-dimensional arrays. The patterned metal layer can be used to route signals and bias voltages between the arrays and the appropriate peripheral circuits. Similar signal routing structures can be used on other types of 3D integrated circuits.

In the manufacturing of such devices, an important step involves making interlayer conductors that contact only one active layer, or only the intended active layers, and that can make successful contact with nanometer scale thin films.

It is desirable therefore to provide manufacturing techniques which improve the reliability and manufacturing margins in the formation of interlayer conductors that may contact the thin film active layers.

SUMMARY

A technology is described that can improve contacts formed with thin film semiconductor layers.

A method is described for forming a circuit that comprises forming a layer of semiconductor material on the substrate. The layer can be a thin film layer of silicon having a thickness less than 20 nm for example. The method includes forming an interlayer insulator over the layer of semiconductor material. An opening is etched in the interlayer insulator to expose a landing area on the layer of semiconductor material. The semiconductor material exposed by the opening is thickened by adding some of the semiconductor material within the opening. The process for adding the semiconductor material can include a blanket deposition, or a selective growth only within the landing area. The process includes depositing a reaction precursor at least on the landing area in the opening. The reaction precursor can be a silicide precursor for making contact with a silicon thin film layer. Also, the process includes causing reaction of the precursor with the semiconductor material in the opening. An interlayer conductor is formed within the opening contacting the results of the reaction.

For an example in which the thin film layer of silicon and the interlayer conductor are formed using tungsten, the reaction precursor can comprise a multilayer combination of titanium and titanium nitride. These materials act as silicide precursors for a reaction with the silicon to form silicide, and also are applied as adhesion and barrier materials for the formation of the interlayer conductor These materials comprise a silicide precursor which causes formation of silicide in the landing area.

Technology described herein can be deployed for making contact to thin film semiconductor layers which are parts of thin film transistors used in logic circuits, analog circuits, memory circuits and in interconnects.

Other aspects and advantages of the technology can be understood on review of the figures, and the detailed description which follows.

DETAILED DESCRIPTION

A detailed description of embodiments of the technology is provided with reference to the FIGS. 1-20.

Figure 1:
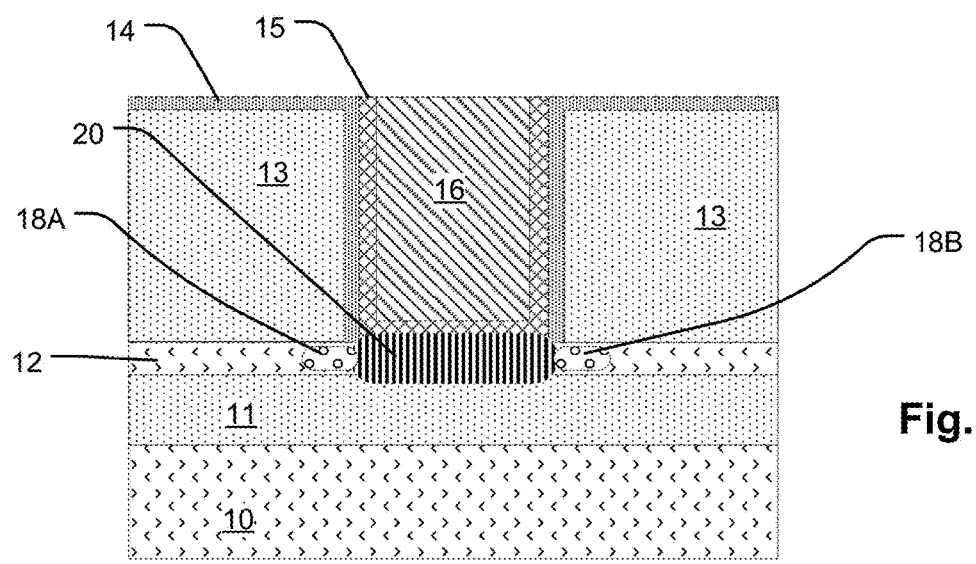
FIG. 1 is a simplified cross-section of an interlayer conductor contacting a thin film semiconductor layer with voids caused by agglomeration.

FIG. 1 is a simplified block diagram illustrating a problem that can be encountered in making contact to thin film semiconductor layers. As used herein, a thin film semiconductor layer is a layer of semiconductor having a thickness less than 20 nm.

The structure in FIG. 1 includes a semiconductor layer 10, such as on a single crystal semiconductor chip or wafer, or a layer of semiconductor on other types of structural substrates. An insulating layer 11 overlies the semiconductor layer 10. A thin film silicon layer 12 overlies the insulating layer. An interlayer insulator 13 covers the thin film silicon layer 12. An interlayer conductor 16, such as a tungsten plug, is disposed within an opening formed in the interlayer insulator 13. In the illustrated structure, the process included formation of a silicon nitride layer 14 over the interlayer insulator 13 including a spacer on the sidewall of the opening which acts as a barrier between the interlayer insulator 13 and the interlayer conductor 16. Also, a layer 15 which, for the purposes of formation of a tungsten plug, can comprise titanium and titanium nitride that line the opening and provide adhesion and barrier functionality for the structure. These materials also comprise a silicide precursor, including at least titanium. The region 20 in FIG. 1 represents a silicide, and perhaps other compounds, formed from a reaction of precursor materials in layer 15 (and potentially material in the interlayer conductor 16) with the silicon layer 12.

In some manufacturing processes, the structure is annealed before formation of the interlayer conductor 16, such as a tungsten plug, to cause a reaction resulting in formation of the silicide and other materials in region 20.

Also, in some manufacturing processes, an implant process can be executed after formation of the opening to increase the doping concentration in the layer 12 in the region of the contact.

In the reaction between the silicon in the layer 12, and the materials in layer 15, the layer 12 acts as the source of silicon. The reaction can cause migration and agglomeration of silicon with the other reactants in the region 20, which agglomeration is fed by the silicon in the layer 12. When the layer 12 is very thin, silicon migration from the regions schematically labeled 18A and 18B, which surround the landing area of the interlayer conductor, 16 can result. This silicon migration can create the voids in the thin silicon layer 12, or otherwise increase the sheet resistance of the thin silicon layer 12.

Figure 2:
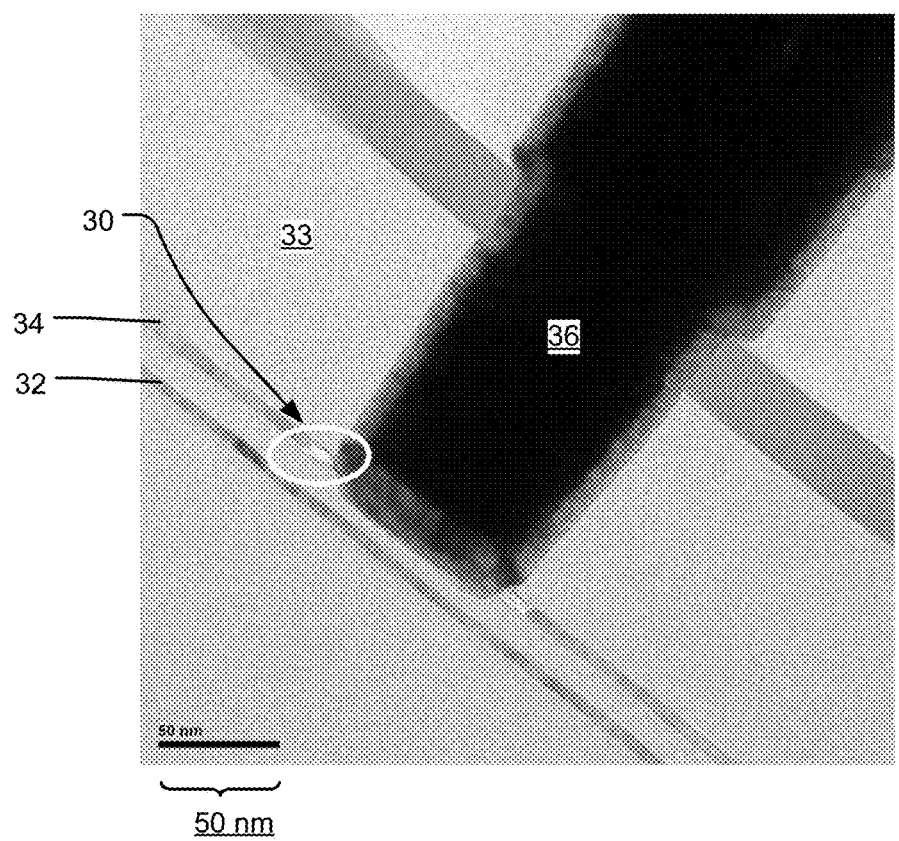
FIG. 2 is a TEM image of an interlayer conductor contacting the thin film semiconductor layer showing voids caused by agglomeration.

FIG. 2 is a transmission electron microscope image of an interlayer conductor 36 which passes through an interlayer insulator 33 to make contact with a thin film silicon layer 34. The thin film silicon layer 34, polysilicon in this example, overlies another thin film silicon layer 32. A silicon oxide layer separates the layers 32 and 34. The scale in the image is indicated by the bar in the lower left, showing that the landing area of the interlayer conductor 36 is on the order of 80 nm in diameter. The thin film silicon layers 32 and 34 have thicknesses of about 5 nm. The thickness of the silicide region in the landing area is more than twice that of the thin film silicon layer 34.

A void 30 can be seen in the image on the perimeter of the landing area for the interlayer conductor 36, which results from agglomeration of silicon in the landing area during the silicide formation. A process is described herein that can prevent formation of such voids.

Figure 3:
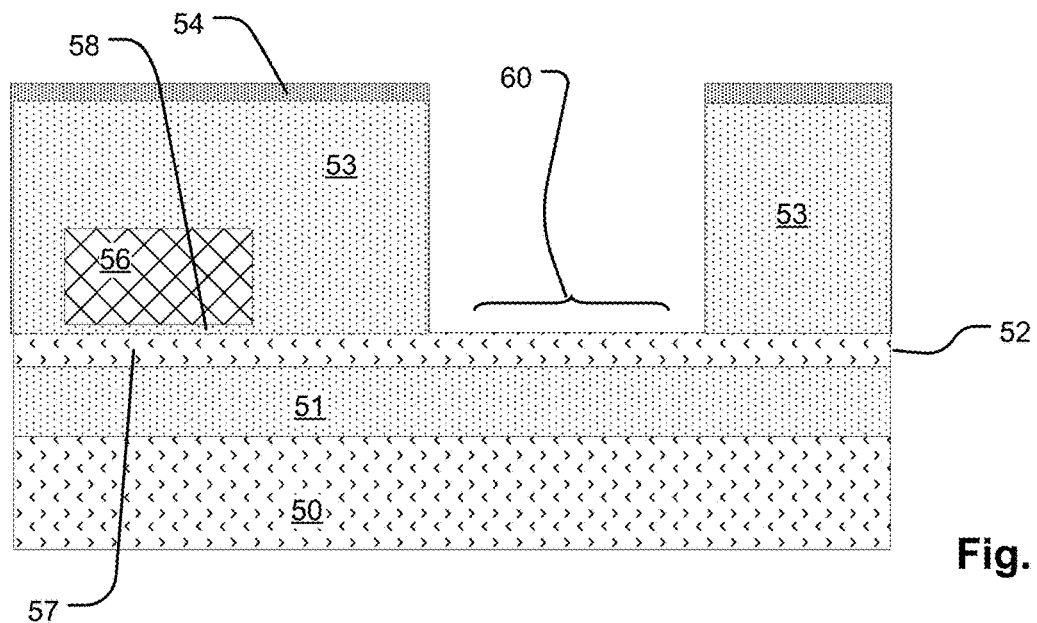
FIGS. 3-10 illustrate stages in a manufacturing process for forming an interlayer conductor contacting a thin film semiconductor layer as described herein.

FIGS. 3-10 illustrate stages in a manufacturing process for formation of a circuit. FIG. 3 shows a structure resulting after formation of a number of components, including a semiconductor layer 50, which can be a semiconductor wafer for example, or a layer of semiconductor material formed over a substrate having a variety of other underlying structures. An insulating layer 51 is disposed over the semiconductor layer 50. A thin film layer 52 of semiconductor material is disposed on the insulating layer 51. A process can be used to form the thin film layer, such as a chemical vapor deposition process or an atomic layer deposition process. A patterning process, such as a photolithographic process, can be applied to form structures in the thin film layer 52. For example, the thin film layer 52 may comprise a strip of semiconductor material having a region 57 used as the channel of a thin film transistor. Also, the strip may include an extension through a landing area 60 at which an interlayer conductor is to make contact with the layer. The structure shown in FIG. 3 shows a gate structure 56 overlying the region 57, and separated from it by a gate dielectric layer 58. The layer forms therefore a thin film transistor having an extension of the thin film layer in which the channel body is formed through the landing area 60. A pattern of doping impurities can be applied in various types of thin film transistors to form source/drain regions, landing areas for contacts, and other features according to the needs of a particular device. Also, the structure shows an interlayer dielectric 53 formed by a process which can be applied after formation of the gate structure 56. The interlayer dielectric 53 can comprise a silicon oxide, multiple layers of varying types of silicon oxide, multiple layers including more than one type of dielectric, and so on. In FIG. 3, a layer 54 is disposed over the interlayer dielectric 53. The layer 54 can act as a hard mask during an etch process used to form an opening to expose the landing area 60 on the thin film layer 52 of semiconductor material. In some examples, when the interlayer dielectric 53 includes silicon oxide, the layer 54 may comprise silicon nitride.

Figure 4:
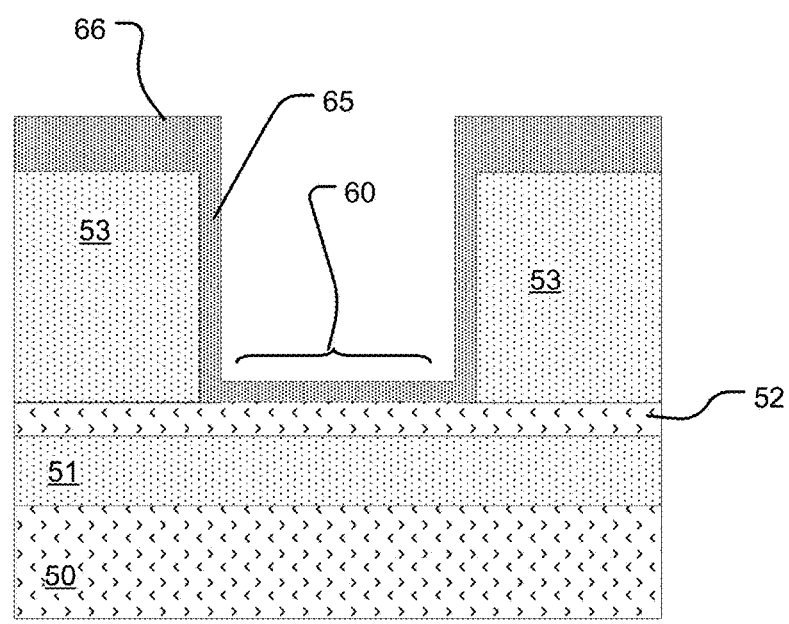

FIG. 4 illustrates the structure after a step of depositing a sidewall barrier material 65 over the structure of FIG. 3, which can be used in some embodiments. Other embodiments may not include this step. In this example, the sidewall barrier material 65 can comprise the same material as used in the layer 54, such as silicon nitride. This results in the thickness of the layer of material in the region 66 being greater than the thickness of material on the sidewall, and of the thickness of the material covering the landing area 60.

Figure 5:
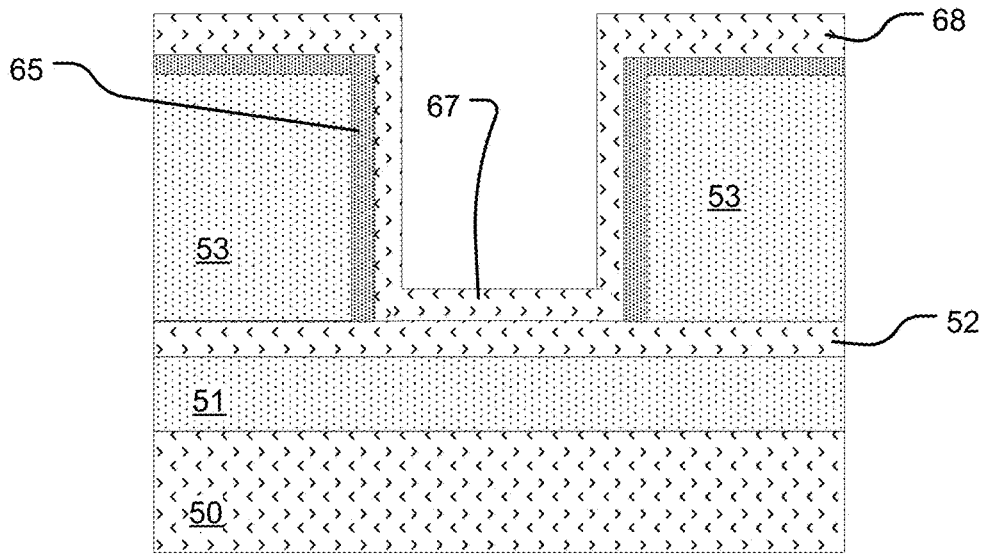

FIG. 5 illustrates the structure after applying a process of anisotropic etching to form a spacer from material 65 on the sidewall of the opening. In this example, the material 65 of the spacer also covers the top surface of the interlayer dielectric 53. Also, the structure shown in FIG. 5 illustrates a stage after a step of depositing a layer 67 of semiconductor material over the landing area to thicken the semiconductor material in the region in which the interlayer conductor makes contact with the thin film layer 52. The layer 67 of semiconductor material can be the same semiconductor material as used for the thin film layer 52. The step of depositing a layer 67 of semiconductor material can be a conformal blanket deposition of the semiconductor material using a chemical vapor deposition process or other process that suits the particular material being formed. As a result of a conformal blanket deposition, the layer 67 includes material in the region 68 overlying the interlayer dielectric 53, and lining the sidewalls of the opening.

For a thin film layer of semiconductor material 52 that is less than 20 nm thick, the thickness of the layer 67 in the landing area exposed by the opening can range from 1 to 300 nm for example to support contact formation. The amount of added semiconductor material can be determined empirically, or estimated using simulation of the reaction processes such as processes described in connection with FIGS. 7 and 8.

Figure 6:
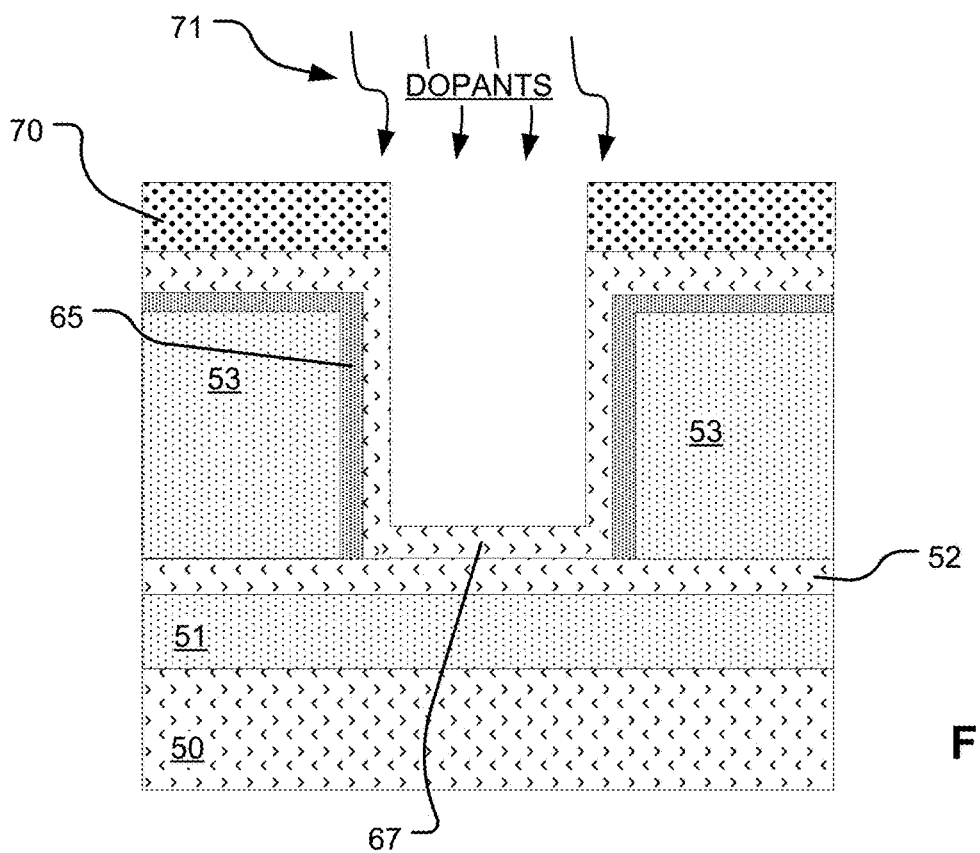

FIG. 6 shows the structure during an ion implant process used to increase the conductivity of the semiconductor material in the layer 67 in the landing area. The structure includes a layer of photoresist 70 having an opening aligned with the opening, and acting as an implant mask. The implant can add dopants 71, such as arsenic for n-type doping and boron for p-type doping for the purposes of improving contact characteristics. After the implant process, the photoresist is stripped. In other embodiments, the implant process may be omitted. In other embodiments, the deposition process used to thicken the thin film layer in the landing area can deposit doped semiconductor material, avoiding the need for an implant.

Figure 7:
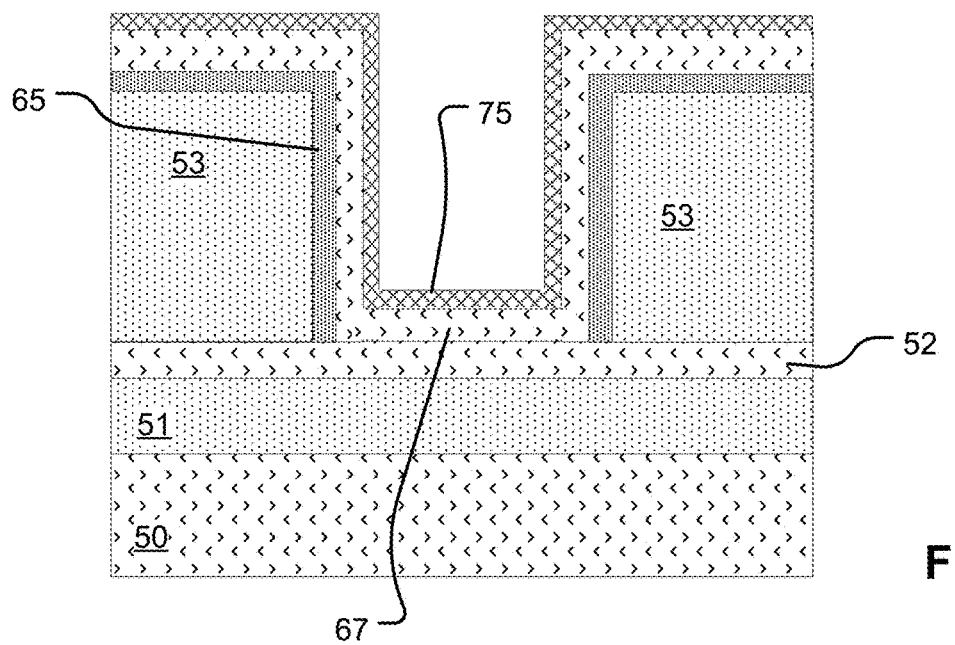

FIG. 7 shows the structure after stripping of the photoresist, and formation of a layer 75 including a reaction precursor by a conformal deposition lining the opening at least in the landing area. In an example in which the interlayer conductor will be made of tungsten, the layer 75 can comprise a multilayer combination of titanium and titanium nitride which can provide adhesion and barrier functions for the interlayer conductor. The titanium and titanium nitride are reaction precursors for silicon that result in formation of at least titanium silicide in the landing area. For interlayer conductors made of copper, the layer 75 may comprise tantalum and tantalum nitride, or other materials. Other types of reaction precursors can be used in the layer 75, including other materials that react with the semiconductor layer, such as cobalt, tungsten, nickel, platinum, molybdenum, and so on.

Figure 8:
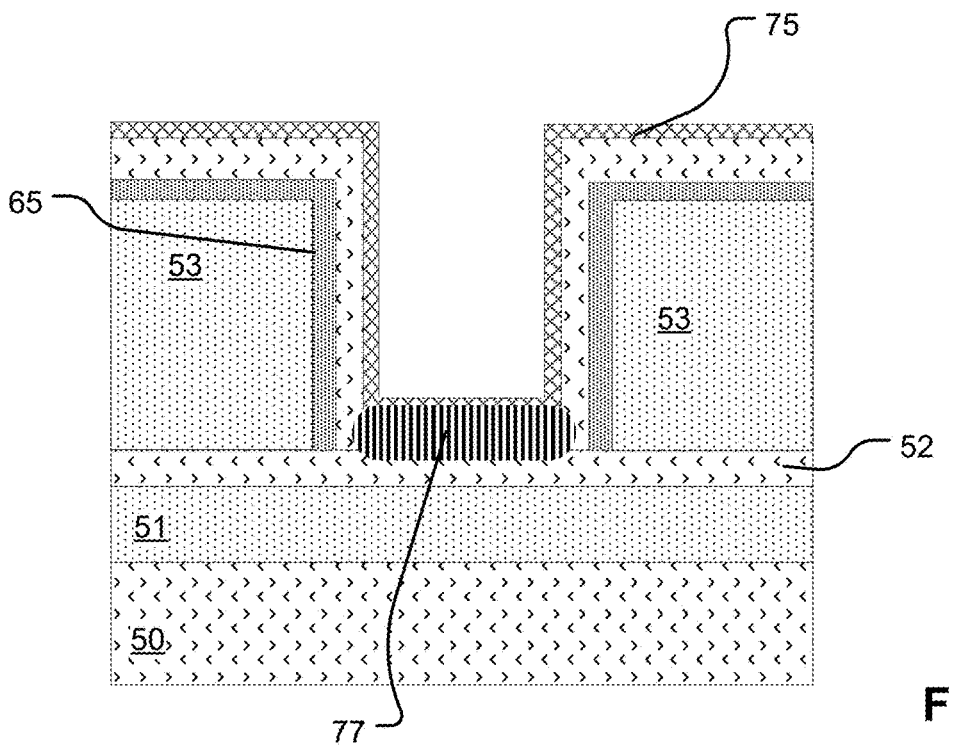

FIG. 8 illustrates the structure after an anneal process, such as a rapid thermal anneal, which causes the reaction of the material in layer 75 with the semiconductor layer and the formation of the reaction products in the region 77. In the example in which the semiconductor layer 52 is silicon, and the material in layer 75 includes a silicide precursor, the anneal results in formation of silicide in the region 77.

Figure 9:
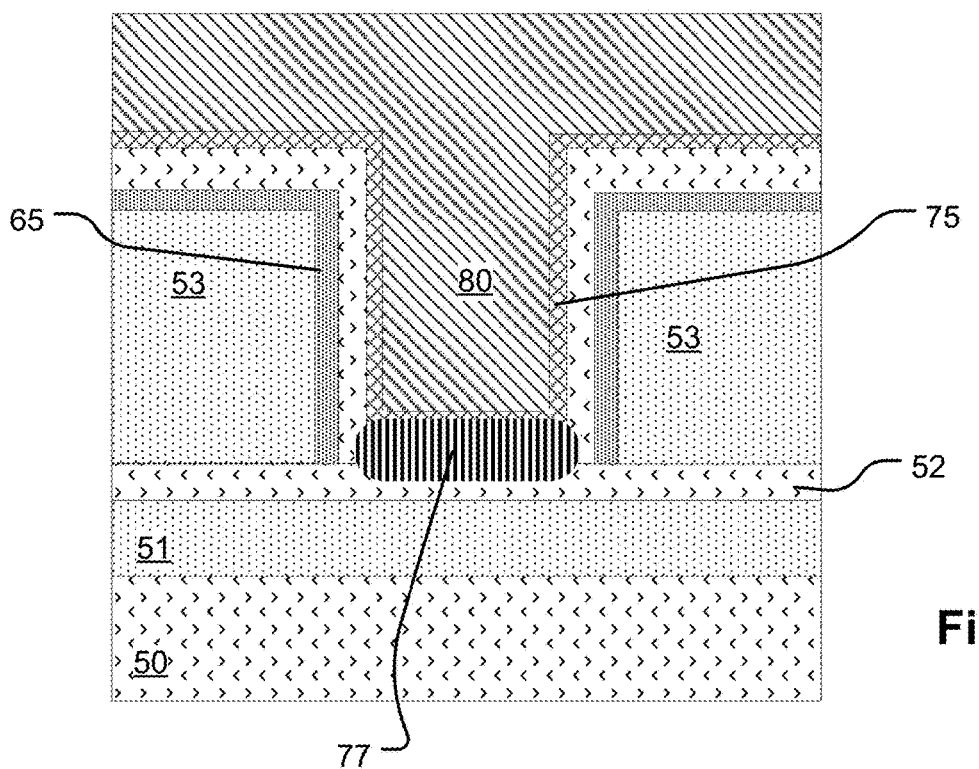

FIG. 9 illustrates the structure after deposition of the conductive material used for the interlayer conductor 80. In one example, the material of the interlayer conductor 80 comprises tungsten. Other conductive materials can be utilized as well.

Figure 10:
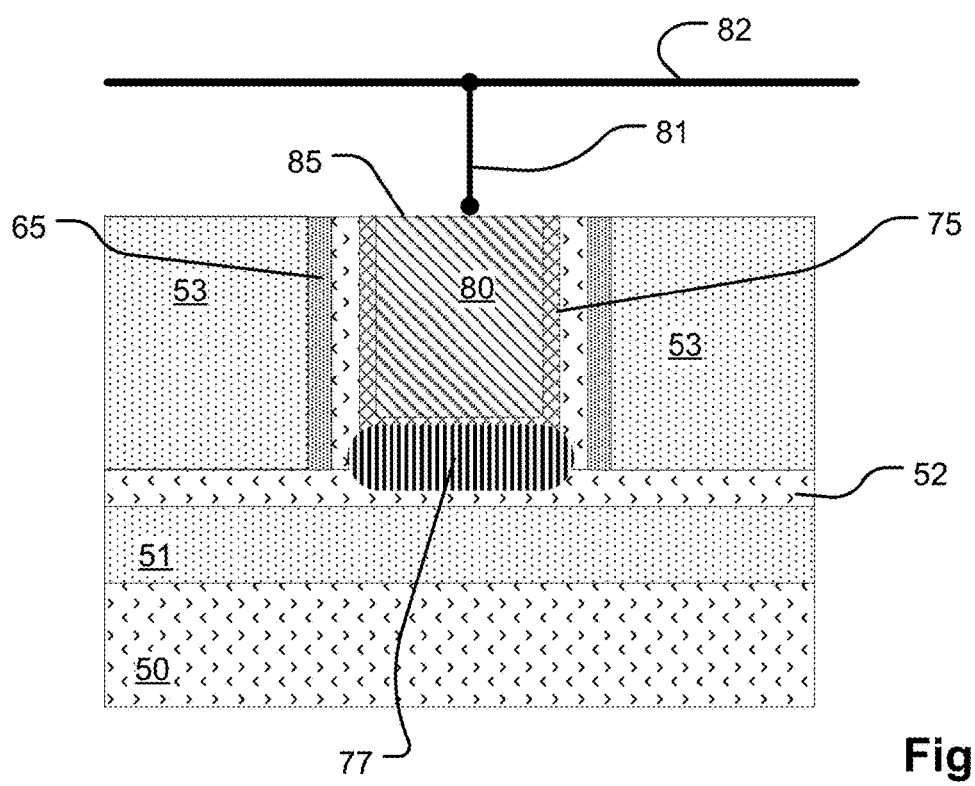

FIG. 10 illustrates the structure after a planarizing process, such as chemical mechanical polishing, to form a smooth upper surface 85 on the interlayer conductor 80, and remove the remnants of the layer 65 which overlie the interlayer dielectric 53, and which had served as a hard mask. This planarizing process may or may not be used in a patterned conductor implementation. Also, FIG. 10 includes schematic connectors 81 and 82 representing interconnection of the interlayer conductor 80 with patterned conductor lines on the integrated circuit.

As a result of the thickening of the semiconductor material in region 77 on the landing area on layer 52, the formation of voids in the layer 52 can be avoided or reduced, and the resistance of the contact and the sheet resistance of the thin film semiconductor layer 52 can be improved. The interlayer conductor 80 can fill an opening having a variety of forms both in layout plan view and in vertical shapes, including trench-like openings, oval or circular via openings, dual-damascene type openings and so on. Also, the opening filled by the interlayer conductor 80 may have serpentine shapes both vertically and in layout.

As shown in FIG. 3, the illustrated portions of the layer 52 can be extensions of a thin film of semiconductor material that is used to form the channel of a thin film transistor. In other embodiments, the layer 52 can act as a gate conductor or other element of an active layer of the device.

Figure 11:
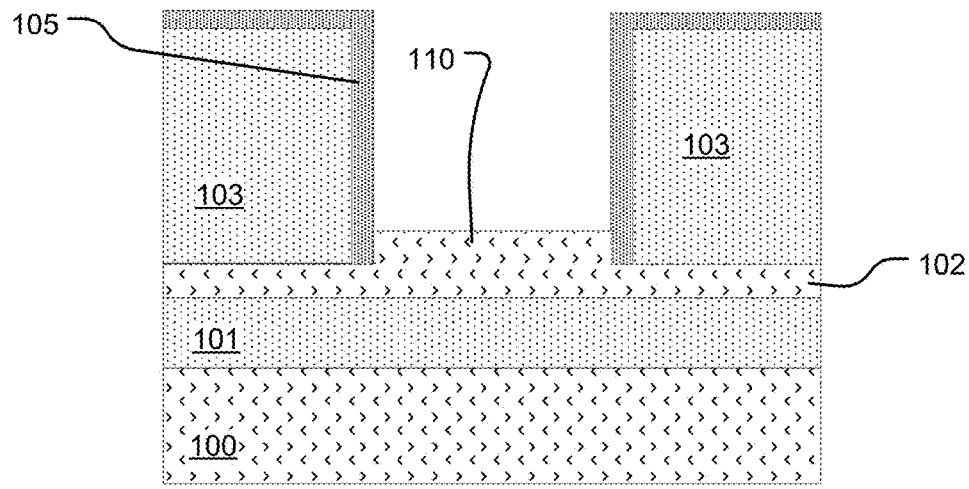
FIGS. 11-16 illustrate stages in an alternative manufacturing process for forming an interlayer conductor contacting a thin film semiconductor layer as described herein.

FIGS. 11 through 16 illustrate stages in an alternative manufacturing method. FIG. 11 shows the structure after a sequence of steps such as that described above with respect to FIGS. 3, 4 and 5, including the formation of a thin film semiconductor layer 102 on an insulating layer 101, which is in turn formed over another layer 100 of semiconductor material. An interlayer dielectric 103 is patterned to form an opening over a landing area on the layer 102. The barrier layer 105 of silicon nitride is formed as shown in the structure of FIG. 11. In FIG. 11, however, the process used to thicken the layer 102 of semiconductor material involves epitaxial growth in the region 110 exposed by the opening over the landing area, which can selectively thicken the layer 102 without formation of sidewalls. This may result in a smaller dimension in layout for the interlayer conductor. For example, for a thin film semiconductor layer 102 that comprises polysilicon, after forming the opening, a selective epitaxial growth of polysilicon is applied to thicken the layer 102 in a landing area exposed by the opening. Selective epitaxial growth of silicon can be accomplished using known techniques, such as techniques described in M. Goulding. THE SELECTIVE EPITAXIAL GROWTH OF SILICON. Journal de Physique IV, 1991, 02 (C2), pp. C2-745-C2-778. <10.1051/jp4:1991290>. <jpa-00249881>, which is incorporated by reference as if fully set forth herein.

For a thin film layer 102 of semiconductor material that is less than 20 nm thick, the thickness added by the epitaxial growth in the region 110 can range from about 1 to 300 nm, for example, to support contact formation. The amount of added semiconductor material can be determined empirically, or estimated using simulation of the reaction processes such as processes described in connection with FIGS. 13 and 14.

Figure 12:
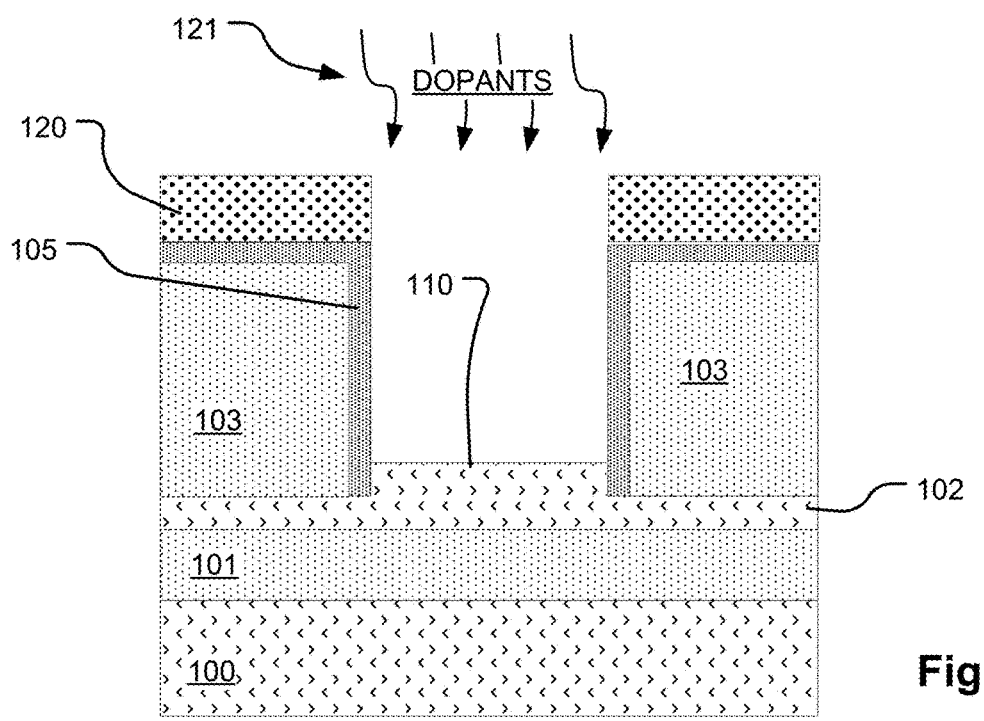

FIG. 12 shows the structure during implantation of impurities to improve the conductivity of the semiconductor material in the region of the contact. The structure includes a layer of photoresist 120 having an pattern defining the location of the opening, and acting as an implant mask. The implant can add dopants 121, such as arsenic for n-type doping and such as boron for p-type doping. After the implant process, the photoresist 120 is stripped. In other embodiments, the implant process may be omitted. In other embodiments, the deposition process used to thicken the thin film layer in the landing area can deposit doped semiconductor material, avoiding the need for an implant.

Figure 13:
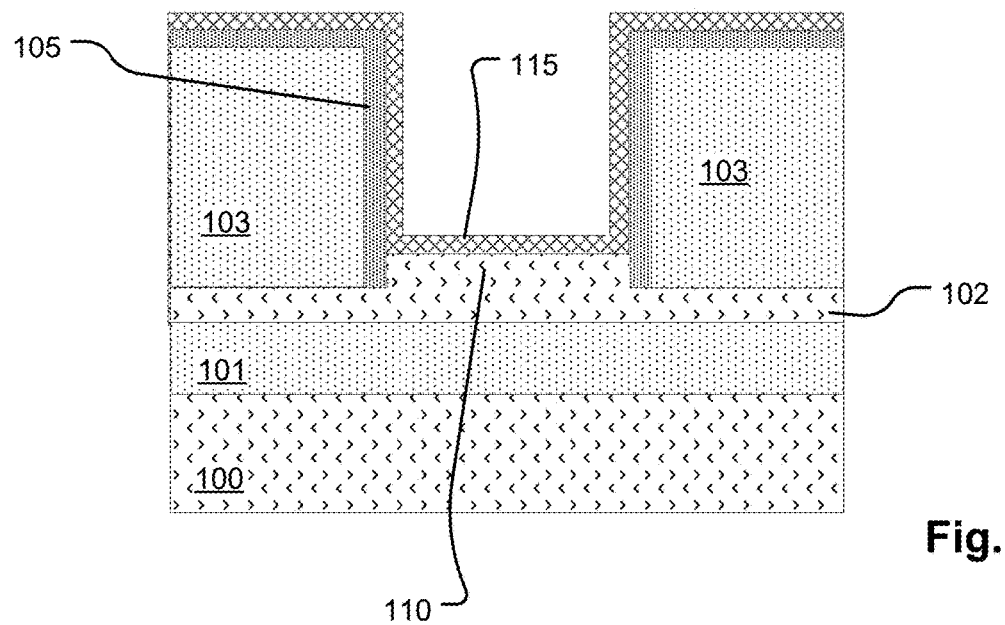

FIG. 13 shows the structure after stripping of the photoresist, and formation of the layer 115 including a reaction precursor, by conformal deposition lining the opening at least in the landing area. In an example in which the interlayer conductor will be made of tungsten, the layer 115 can comprise a multilayer combination of titanium and titanium nitride which can provide adhesion barrier functions for the interlayer conductor. The titanium and titanium nitride are reaction precursors for silicon that results in formation of at least titanium silicide in the landing area. For interlayer conductors made of copper, the layer 115 may comprise tantalum and tantalum nitride, or other materials. Other types of reaction precursors can be used in the layer 115, including other materials that react with the semiconductor layer, such as cobalt, tungsten, nickel, platinum, molybdenum, and so on.

Figure 14:
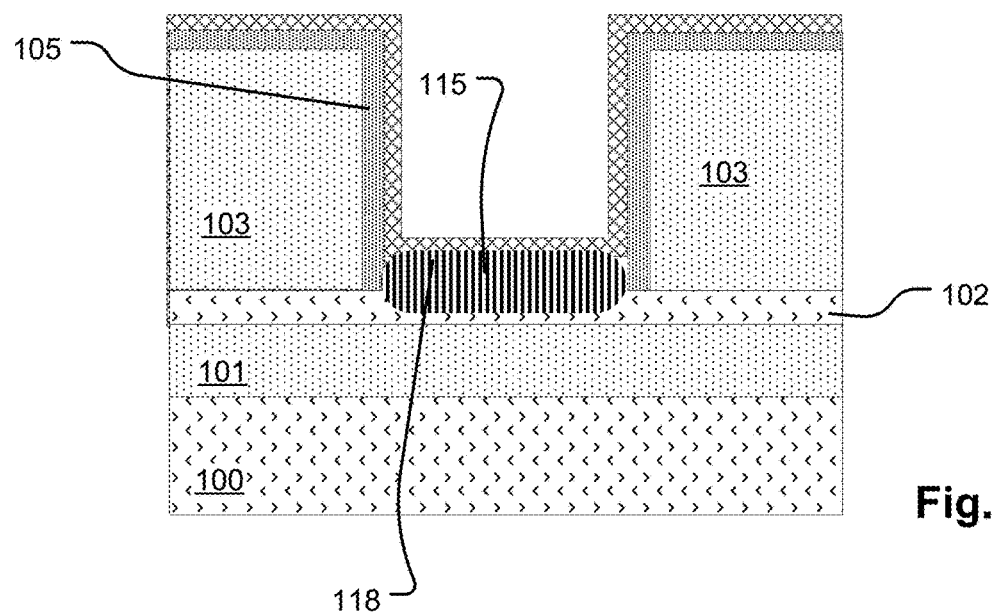

FIG. 14 illustrates the structure after an anneal process, such as a rapid thermal anneal, which causes the reaction of the material in layer 115 with the semiconductor layer 102 in region 110, and the formation of reaction products in the region 118. The example in which the semiconductor layer 102 is silicon, and the material in layer 75 includes a silicide precursor, the anneal results in formation of silicide in the region 118.

Figure 15:
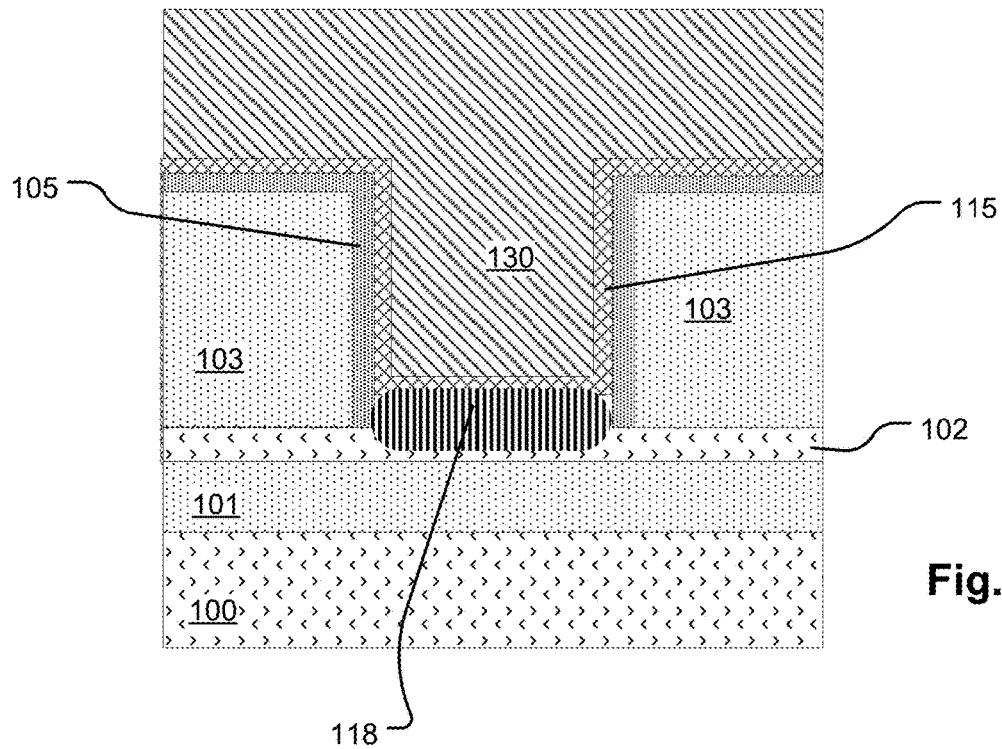

FIG. 15 illustrates the structure after deposition of the conductive material used for the interlayer conductor 130. In one example, the material of the interlayer conductor comprises tungsten. Other conductive materials can be utilized as well.

Figure 16:
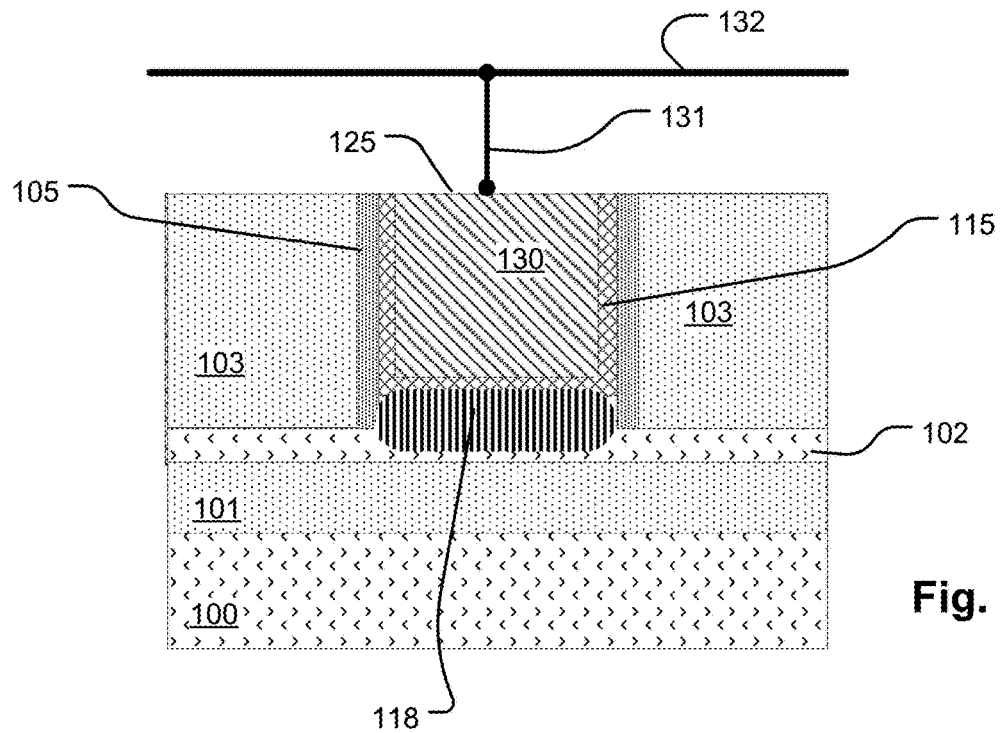

FIG. 16 illustrates the structure after a planarizing process, such as chemical mechanical polishing, to form a smooth upper surface 125 on the interlayer conductor 130, and to remove the remnants of the layer 105 which overlie the interlayer dielectric 103. The planarizing process may or may not be used in a patterned conductor implementation. Also, FIG. 16 includes schematic connectors 131 and 132 representing interconnection of the interlayer conductor 130 with patterned conductor lines on the integrated circuit.

As a result of the thickening of the semiconductor material in the region 118 on the landing area of the layer 102, the formation of voids in the layer 102 can be avoided or reduced, and the resistance of the contact and the sheet resistance of the thin film semiconductor layer can be reduced.

Figure 17:
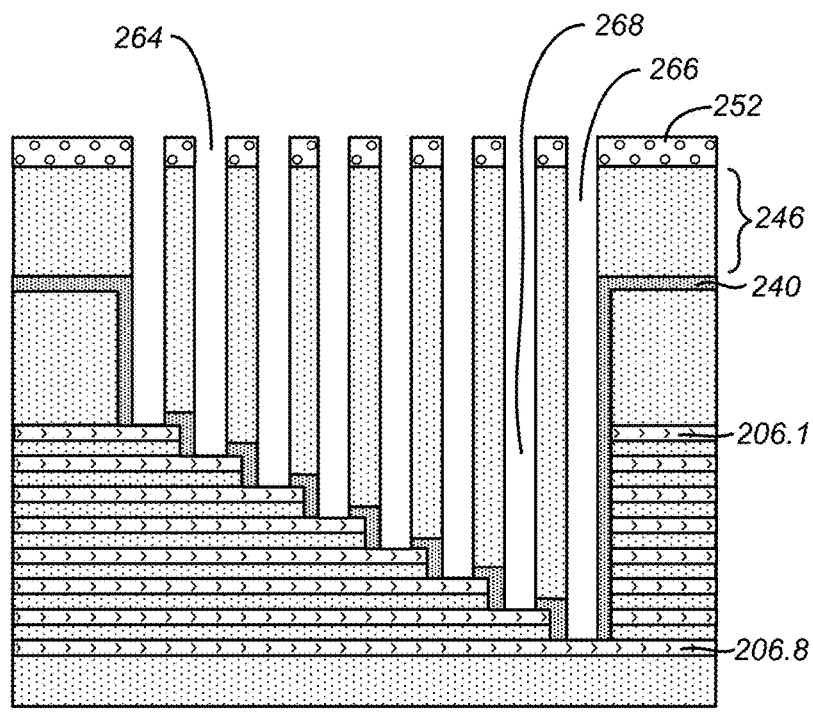
FIGS. 17-19 illustrate stages in manufacturing of a stairstep contact structure including interlayer conductors as described herein.
Figure 18:
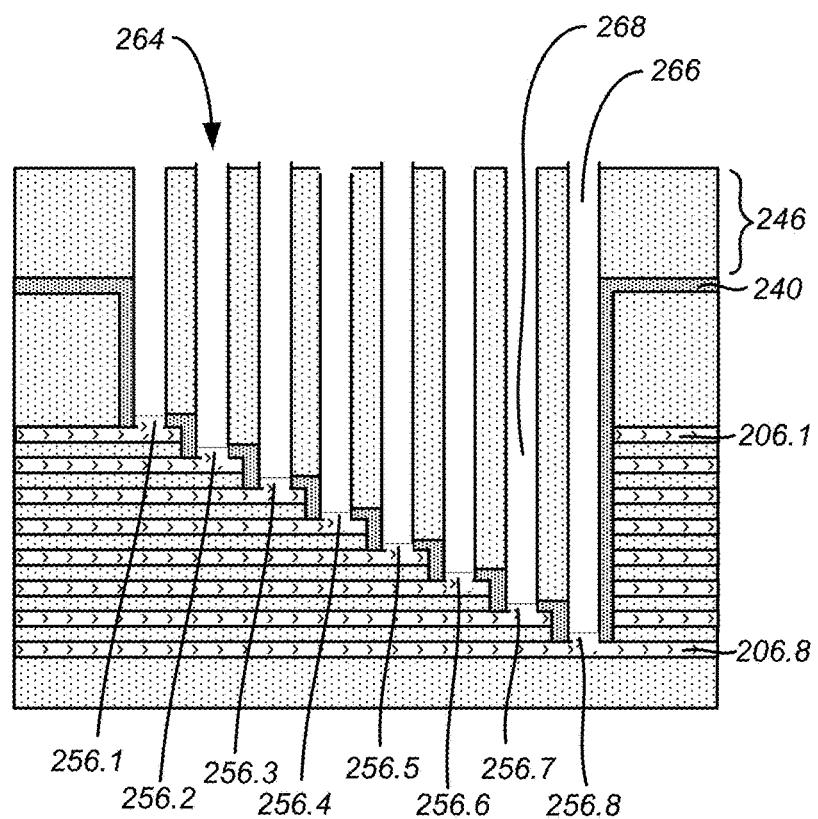
Figure 19:
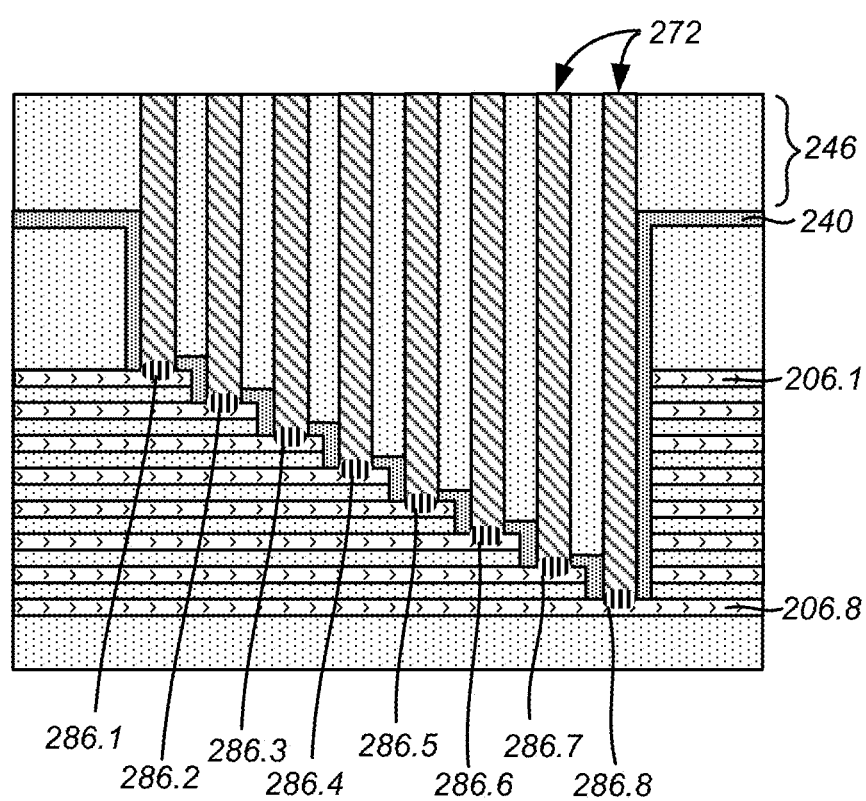

FIGS. 17, 18 and 19 illustrate formation of interlayer conductors in a stairstep pattern, on a three-dimensional integrated circuit including multiple thin film polysilicon layers, including layers 206.1 through 206.8 this example. As mentioned above, other types of semiconductor material can be used for the technology described herein as well.

The multiple thin film polysilicon layers 206.1 through 206.8 are deposited with insulating layers in between to form a stack of active layers on an integrated circuit. The stack is etched to expose landing areas on each of the layers, and an interlayer dielectric layer 246 overlies the stack. A liner 240 of an etch stop material, such as silicon nitride, can line the structure after etching to form the stairstep openings illustrated, and before the interlayer dielectric layer 246 is formed. The openings 264, 268, and 266 have varying depths depending on the active layer to which contact is made. As described herein, the structure shown in FIG. 17 results from a process to create the openings by a patterned etch using photoresist 252, which exposes landing areas on each of the layers 206.1-206.8.

A variety of technologies can be deployed for this purpose. One example is described in commonly owned U.S. patent application Ser. No. 13/867,905, filed on 22 Apr. 2013, entitled INTERLAYER CONDUCTOR AND METHOD FOR FORMING, now U.S. Pat. No. 8,928,149, which is incorporated by reference as if fully set forth herein.

The structure shown in FIG. 18 results from stripping of the photoresist, and applying a process to thicken the thin film semiconductor layers 206.1 through 206.8 in the landing areas exposed by the opening. As discussed above, two techniques for thickening the thin film semiconductor layers include chemical vapor deposition and selected epitaxial growth. Thus, after the thickening process, the thin film semiconductor layers have thicker regions 256.1 through 256.8 in the landing areas on the corresponding thin film active layers.

FIG. 19 shows the structure after performing adding a reaction precursor, and an anneal process to induce the silicide formation in the regions 286.1 through 286.8, and filling of the openings with the conductor, such as tungsten, used as the interlayer conductors 272.

FIGS. 3-19 illustrate stages in manufacturing processes. The process steps correspond to the illustrated stages. It will be appreciated that many of the steps can be combined or performed in a different sequence. In some cases, as the reader will appreciate, a rearrangement of steps will achieve the same results only if certain other changes are made as well. In other cases, as the reader will appreciate, a rearrangement of steps will achieve the same results only if certain conditions are satisfied. Furthermore, it will be appreciated that the discussion herein refers to steps that are pertinent to an understanding of the invention, and it will be understood that numerous additional steps for accomplishing other functions can be performed before, after and between those shown.

The technology described herein for formation of interlayer conductors is useful in any type of circuit deploying thin film transistors or thin film semiconductor layers used for connection to thin film transistors. The thin film transistors can be memory devices, logic devices, analog devices and switching devices for example. The technology can be deployed as well to improve contact characteristics in devices such as CMOS devices that may not include thin film layers of semiconductor material.

Figure 20:
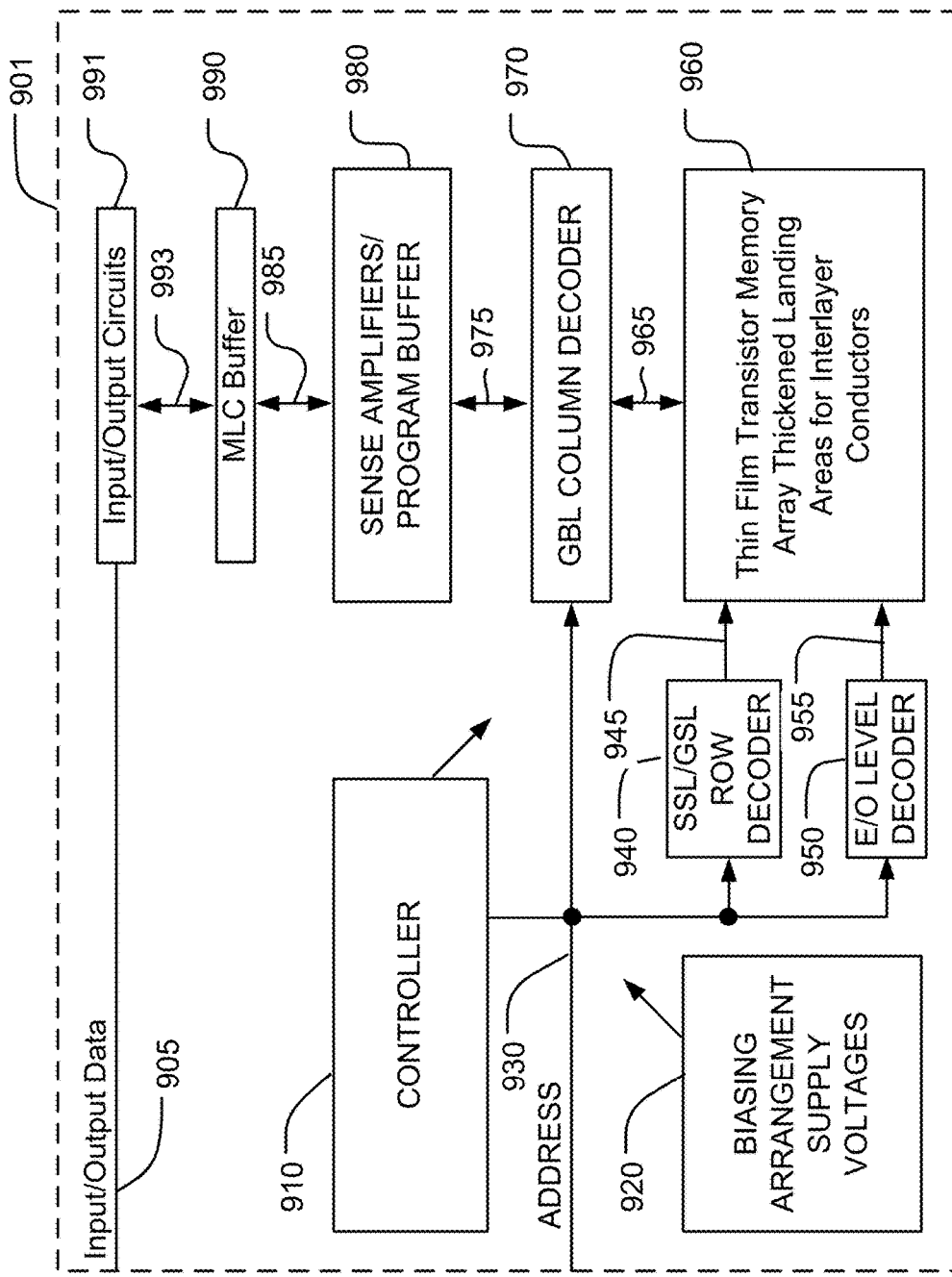
FIG. 20 is a simplified block diagram of an integrated circuit including thickened landing areas for contacts on thin film semiconductor layers as described herein.

FIG. 20 is a schematic diagram of an integrated circuit including a memory array including memory cells comprising thin film transistors. One example of such as circuit is described in co-pending, and commonly owned U.S. patent application Ser. No. 14/284,306, entitled 3D INDEPENDENT DOUBLE GATE FLASH MEMORY, filed 21 May 2014, which is incorporated by reference as if fully set forth herein. Deploying the technology described herein, the landing areas on thin film semiconductor layers, such as in the stairstep interlayer conductor structures, are thickened as described above. In some embodiments, the memory array may comprise a 3D NAND array with vertical or horizontal thin film transistors.

In the illustrated example, the integrated circuit 901 includes a memory array 960 including one or more memory blocks.

An SSL decoder 940 is coupled to a plurality of SSL lines 945, arranged in the memory array 960. An even/odd level decoder 950 is coupled to a plurality of even/odd word lines 955. A global bit line column decoder 970 is coupled to a plurality of global bit lines 965 arranged along columns in the memory array 960 for reading data from and writing data to the memory array 960. Addresses are supplied on bus 930 from control logic 910 to decoder 970, decoder 940 and decoder 950. Sense amplifier and program buffer circuits 980 are coupled to the column decoder 970, in this example via first data lines 975. The program buffer in circuits 980 can store program codes for multiple-level programming. The column decoder 970 can include circuits for selectively applying program and inhibit voltages to bit lines in the memory in response to the data values in the program buffer.

Sensed data from the sense amplifier/program buffer circuits are supplied via second data lines 985 to multi-level data buffer 990, which is in turn coupled to input/output circuits 991 via a data path 993. Also, input data is applied in this example to the multi-level data buffer 990 for use in support of multiple-level program operations for each of the independent sides of the independent double gate cells in the array.

Input/output circuits 991 drive the data to destinations external to the integrated circuit 901. Input/output data and control signals are moved via data bus 905 between the input/output circuits 991, the control logic 910 and input/output ports on the integrated circuit 901 or other data sources internal or external to the integrated circuit 901, such as a general purpose processor or special purpose application circuitry, or a combination of modules providing system-on-a-chip functionality supported by the memory array 960.

In the example shown in FIG. 20, control logic 910, using a bias arrangement state machine, controls the application of supply voltages generated or provided through the voltage supply or supplies in block 920, such as read, erase, verify and program bias voltages. The control logic 910 is coupled to the multi-level buffer 990 and the memory array 960. The control logic 910 includes logic to control multiple-level program operations. The control logic and other peripheral circuitry can include thin film transistors having extensions of thin film layers in which the channels are formed, on which landing areas for interlayer conductors are thickened, as described herein. While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for forming a 3D circuit, comprising:
   forming a stack including alternating thin film layers of semiconductor material and insulating material, each of the thin film layers of semiconductor material on respective ones of the thin film layers of insulating material in the stack, each of the thin film layers of semiconductor material having a thickness less than 20 nm;

forming an interlayer insulator over the stack;

etching a pattern of openings in the interlayer insulator and the stack to expose landing areas on each of the thin film layers of semiconductor material;

forming a layer of sidewall barrier material within the openings;

etching the layer of sidewall barrier material to expose the landing areas and form spacers on the sidewalls of the openings;

adding some of said semiconductor material on the exposed landing areas within the openings;

adding p-type or n-type dopants to the added semiconductor material by ion implantation;

depositing a reaction precursor on said doped semiconductor material on the landing areas in the openings and causing reaction of the precursor with the semiconductor material within the openings; and forming interlayer conductors within the openings;

wherein each of the landing areas exposed by the openings has a maximum width that is at least one (1) times the thickness of the thin film layer of semiconductor material in the landing areas.

2. The method of claim 1, wherein said forming interlayer conductors includes depositing a conductor material to fill the openings after causing said reaction.

3. The method of claim 1, wherein said adding some of said semiconductor material includes conformal deposition of a layer of said semiconductor material lining the exposed landing areas and the spacers on the sidewalls of the openings.

4. The method of claim 1, wherein said adding some of said semiconductor material includes causing epitaxial growth of said semiconductor material in the exposed landing areas.

5. The method of claim 1, wherein said semiconductor material is silicon.

6. The method of claim 5, wherein said reaction precursor comprises a silicide precursor.

7. The method of claim 6, wherein said silicide precursor comprises titanium.

8. The method of claim 6, wherein said silicide precursor comprises cobalt.

9. The method of claim 1, wherein the interlayer conductor comprises tungsten.

10. The method of claim 1, wherein the interlayer conductor comprises copper.

11. The method of claim 1, including:
forming a thin film transistor on a substrate, the thin film transistor including a strip of semiconductor material including a channel region for the thin film transistor and including an extension, said extension including said thin film layer of semiconductor material.

12. A circuit formed according to the method of claim 1.

13. A method for forming a circuit, comprising:
forming a stack including alternating thin film layers of silicon and insulating material, each of the thin film layers of silicon on respective ones of the thin film layers of insulating material in the stack, each of the thin film layers of silicon having a thickness less than 20 nm;

forming an interlayer insulator over the stack;

etching openings in the interlayer insulator and the stack to expose landing areas on each of the layers of silicon;

forming a layer of sidewall barrier material within the openings;

etching the layer of sidewall barrier material to expose the landing areas and form spacers on the sidewalls of the openings;

adding some silicon on the exposed landing areas within the openings;

adding p-type or n-type dopants to the added silicon by ion implantation;

depositing a silicide precursor on the doped silicon in the landing areas in the openings and causing reaction of the precursor with the silicon to form a silicide within the openings; and forming interlayer conductors in contact with the silicide within the openings.

14. The method of claim 13, wherein said forming interlayer conductors includes depositing a conductor material to fill the openings after causing said reaction.

15. The method of claim 13, wherein said adding some silicon includes conformal deposition of a layer of silicon lining the openings.

16. The method of claim 13, wherein said adding some silicon includes causing epitaxial growth of silicon in the landing areas.

17. A circuit formed according to the method of claim 13.

* * * * *

UNITED STATES PATENT AND TRADEMARK OFFICE
CERTIFICATE OF CORRECTION

PATENT NO. : 9,627,498 B2
APPLICATION NO. : 14/717177
DATED : April 18, 2017
INVENTOR(S) : Jia-Rong Chiou et al.

Page 1 of 1

It is certified that error appears in the above-identified patent and that said Letters Patent is hereby corrected as shown below:

In Claim 1, Column 9, Line 1, please delete the word "laver" and insert the word -- layer --.

Signed and Sealed this
Twelfth Day of December, 2017

Joseph Matal
*Performing the Functions and Duties of the
Under Secretary of Commerce for Intellectual Property and
Director of the United States Patent and Trademark Office*